United States Patent
Longoni et al.

(10) Patent No.: US 11,889,765 B2
(45) Date of Patent: Jan. 30, 2024

(54) MICRO ELECTRO MECHANICAL SYSTEM AND MANUFACTURING METHOD THEREOF

(71) Applicant: STMicroelectronics S.r.l., Agrate Brianza (IT)

(72) Inventors: Gianluca Longoni, Cernusco sul Naviglio (IT); Luca Seghizzi, Milan (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 213 days.

(21) Appl. No.: 17/181,432

(22) Filed: Feb. 22, 2021

(65) Prior Publication Data
US 2021/0265556 A1  Aug. 26, 2021

(30) Foreign Application Priority Data
Feb. 26, 2020  (IT) .................. 102020000003967

(51) Int. Cl.
*B81B 3/00* (2006.01)
*H10N 30/20* (2023.01)
(Continued)

(52) U.S. Cl.
CPC ....... *H10N 30/2042* (2023.02); *B81B 3/0021* (2013.01); *H02N 2/186* (2013.01);
(Continued)

(58) Field of Classification Search
None
See application file for complete search history.

(56) References Cited

U.S. PATENT DOCUMENTS

| 8,723,398 B2 * | 5/2014 | Lee | H02N 2/181 |
| | | | 310/329 |
| 2008/0174273 A1 * | 7/2008 | Priya | H10N 30/306 |
| | | | 310/319 |

(Continued)

FOREIGN PATENT DOCUMENTS

| WO | 2011/058874 A1 | 5/2011 |
| WO | 2018/105132 A1 | 6/2018 |

OTHER PUBLICATIONS

Felmetsger et al., "Sputter Deposition of Piezoelectric AlN Thin Films on Vertical Walls of Micromechanical Devices," 2$^{nd}$ International Workshop on Piezoelectric MEMS, Lausanne, Switzerland, Sep. 6-7, 2011, 20 pages.

(Continued)

*Primary Examiner* — Benjamin P Sandvik
(74) *Attorney, Agent, or Firm* — Seed IP Law Group LLP

(57) ABSTRACT

A MEMS device is provided that includes a semiconductor substrate including a main surface extending perpendicular to a first direction and a side surface extending on a plane parallel to the first direction and to a second direction that is perpendicular to the first direction. At least one cantilevered member protrudes from the side surface of the semiconductor substrate along a third direction that is perpendicular to the first and second directions. The at least one cantilevered member includes a body portion that includes a piezoelectric material. The body portion has a length along the third direction, a height along the first direction and a width along the second direction, and the height is greater than the width. The at least one cantilevered member is configured to vibrate by lateral bending along a direction perpendicular to the first direction.

20 Claims, 17 Drawing Sheets

(51) Int. Cl.
- H02N 2/18 (2006.01)
- H10N 30/05 (2023.01)
- H10N 30/074 (2023.01)
- H10N 30/85 (2023.01)
- H10N 30/00 (2023.01)

(52) U.S. Cl.
CPC ........... H10N 30/05 (2023.02); H10N 30/074 (2023.02); H10N 30/10513 (2023.02); H10N 30/85 (2023.02); *B81B 2203/0118* (2013.01)

(56) References Cited

U.S. PATENT DOCUMENTS

| | | | | |
|---|---|---|---|---|
| 2008/0252174 | A1* | 10/2008 | Mohammadi | G01L 1/16 310/319 |
| 2012/0068576 | A1* | 3/2012 | Lee | H02N 2/188 310/339 |
| 2013/0127295 | A1* | 5/2013 | Jun | H10N 30/306 977/948 |
| 2013/0154439 | A1* | 6/2013 | Lee | H10N 30/01 310/314 |
| 2013/0313946 | A1* | 11/2013 | Lee | H02N 2/22 29/25.35 |
| 2016/0373031 | A1* | 12/2016 | Procopio | H02N 2/186 |
| 2018/0262130 | A1 | 9/2018 | Okada et al. | |
| 2019/0315622 | A1* | 10/2019 | Higuchi | G01C 19/5628 |

OTHER PUBLICATIONS

Karmazyn, "Synchronization of coupled mechanical oscillators in the presence of noise and parameter mismatch," doctoral thesis, Lodz University of Technology, 2014, 102 pages.

Mackus et al., "From the Bottom-Up: Toward Area-Selective Atomic Layer Deposition with High Selectivity," *Chem. Mater. 31*:2-12, 2019.

Palokangas et al., "Direct Bonding of Oxidized Cavity Wafers," *ECS Transactions 16*(8), 2008, 7 pages.

Suni et al., "Silicon-on-Insulator Wafers with Buried Cavities," *Journal of the Electromechanical Society 153*(4):G299-G303, 2006.

Yoshida et al., "Fabrication and characterization of laterally-driven piezoelectric bimorph MEMS actuator with sol-gel-based high-aspect-ratio PZT structure," *J. Micromech. Microeng. 23*, 2013, 11 pages.

* cited by examiner

MICRO ELECTRO MECHANICAL SYSTEM AND MANUFACTURING METHOD THEREOF

BACKGROUND

Technical Field

The present disclosure relates to the field of the Micro Electro Mechanical Systems (hereinafter referred to as "MEMS").

Description of the Related Art

A MEMS device comprises miniaturized mechanical, electrical and/or electronic components integrated in a same semiconductor material substrate, for example, silicon, by means of micromachining techniques (for example, lithography, deposition, etching, growth).

MEMS device can be used in a wide range of different applications, such as for implementing energy harvesting devices, optical switches, radio-frequency switched and micromanipulators.

Energy harvesting is the process of converting ambient energy present in the environment into electrical energy for powering electronic devices. Sources of energy that can be harvested comprise both natural sources readily available from the environment and artificial sources generated from system activities, such as the vibration energy generated by a mechanical system when the latter is operating.

Among the known MEMS energy harvesting devices, Piezoelectric Energy Harvesting devices (hereinafter, briefly referred to as "PEH devices") are known. A PEH device is a MEMS energy harvesting device including a piezoelectric element designed to convert vibration energy into electrical energy.

PEH devices may comprise a (e.g., silicon) substrate having a main surface and (silicon) cantilevered members suspended with respect to the substrate. The cantilevered members are configured to vibrate (e.g., through bending) along a direction perpendicular to the main surface of the substrate at a corresponding resonance frequency when the PEH device moves and/or is subjected to vibrations. This kind of vibration is also referred to as "out-of-plane vibration", in the sense that the cantilevered members intersect a plane comprising the main surface of the substrate when they vibrate. Each cantilevered member supports a thin layer of piezoelectric material between two conductive layers acting as electrodes. When the PEH device moves and/or is subjected to vibrations, the cantilevered members start to vibrate. The vibration of each cantilevered member causes the corresponding layer of piezoelectric material to bend and accordingly generate an electric potential difference across the electrodes thereof, which can be provided to an external load through proper electric connections.

These kind of PEH devices can be used for powering low-power sensing nodes in Internet of Things ("IoT") sensing networks and in other low power applications, such as, for example, as powering aids for extending battery life of electronic portable devices.

BRIEF SUMMARY

The Applicant has found that the known PEH devices are not particularly efficient because affected by several drawbacks.

Cantilevered members in the known PEH devices comprises thin layers of different materials (comprising a thin piezoelectric layer) stacked on top of each other. Since cantilevered members manufactured by overlapping different thin layers on the top of each other are subjected to upward or downward bending depending on structural stresses affecting said overlapped layers, and since such bending negatively affect the conversion efficiency of the PEH device, known solutions provide to reduce such unwanted bending by providing cantilevered members with a reduced aspect ratio (length-to-width ratio).

However, PEH devices having cantilevered members with reduced aspect ratio cannot efficiently generate energy at lower resonance frequencies (e.g., lower than 1 KHz). It has to be appreciated that the abovementioned bending drawback is exacerbated in case the cantilevered member is provided with a seismic mass for the tuning of the resonance frequency.

Moreover, PEH devices using cantilevered members with a reduced aspect ratio usually produce only low output voltages.

Another disadvantage of known PEH devices relates to the manufacturing process thereof. Specifically, because of manufacturing process tolerances, the thin piezoelectric layers of the cantilevered members of a single PEH device are usually affected by different superficial stresses, causing mismatching in the vibrations.

The Applicant has found that other kinds of MEMS devices having cantilevered members comprising piezoelectric material (e.g., optical switches, radio-frequency switched and micromanipulators) can be affected by similar drawbacks.

In view of the above, the Applicant has devised a solution for obtaining an improved MEMS device having cantilevered members comprising piezoelectric material.

An aspect of the present disclosure relates to a MEMS device.

According to an embodiment of the present disclosure, the MEMS device comprises a semiconductor substrate comprising a main surface extending perpendicular to a first direction and a side surface extending on a plane parallel to the first direction and to a second direction.

According to an embodiment of the present disclosure, said second direction is perpendicular to said first direction.

According to an embodiment of the present disclosure, at least one cantilevered member protrudes from the side surface of the semiconductor substrate along a third direction perpendicular to said first and second directions.

According to an embodiment of the present disclosure, each cantilevered member comprises a body portion comprising a piezoelectric material.

According to an embodiment of the present disclosure, said body portion has a length along the third direction, a height along the first direction and a width along the second direction.

According to an embodiment of the present disclosure said height is larger than said width.

According to an embodiment of the present disclosure, each cantilevered member is thus configured to vibrate by lateral bending along a direction perpendicular to the first direction.

According to an embodiment of the present disclosure, each body portion has a first end connected to the side surface of the semiconductor substrate and a second free end opposite to the first end.

According to an embodiment of the present disclosure, said body portion comprises a layer of piezoelectric material between two collector layers.

According to an embodiment of the present disclosure said layer of piezoelectric material and each of said two collector layers extends from said first end to said second end of the body portion along said first direction and along said third direction.

According to an embodiment of the present disclosure, said piezoelectric material has a crystalline orientation perpendicular to said first direction.

According to an embodiment of the present disclosure each body portion comprises a seismic mass portion connected to the second end thereof.

According to an embodiment of the present disclosure, each cantilevered member is associated to a corresponding first conductive track and a second conductive track electrically coupled to the piezoelectric material of the body portion of said cantilevered member at spaced apart regions of the piezoelectric material spaced apart along the second direction.

According to an embodiment of the present disclosure, a corresponding voltage difference develops across said first and second conductive tracks when cantilevered member vibrates.

According to an embodiment of the present disclosure, said first and second conductive tracks contact the collector layers of the body portion of the corresponding cantilevered member.

According to an embodiment of the present disclosure, the MEMS device further comprises a plurality of cantilevered members.

According to an embodiment of the present disclosure, the first conductive tracks associated to each cantilevered member are connected to a same first common conductive track.

According to an embodiment of the present disclosure, the second conductive tracks associated to each cantilevered member are connected to a same second common conductive track.

According to an embodiment of the present disclosure, said semiconductor substrate is movably coupled to a fixed substrate by means of an elastic support structure.

According to an embodiment of the present disclosure, the MEMS device is a piezoelectric energy harvester device.

Another aspect of the present disclosure relates to an electronic system comprising one or more MEMS devices.

Another aspect of the present disclosure relates to a method for manufacturing a MEMS device.

According to an embodiment of the present disclosure, the method comprises providing a semiconductor substrate comprising a main surface extending perpendicular to a first direction and a side surface extending on a plane parallel to the first direction and to a second direction.

According to an embodiment of the present disclosure, said second direction is perpendicular to said first direction.

According to an embodiment of the present disclosure, the method comprises forming at least one cantilevered member protruding from the side surface of the semiconductor substrate along a third direction perpendicular to said first and second directions.

According to an embodiment of the present disclosure, each cantilevered member comprises a body portion comprising a piezoelectric material.

According to an embodiment of the present disclosure, said body portion has a length along the third direction, a height along the first direction and a width along the second direction.

According to an embodiment of the present disclosure, said height is larger than said width.

According to an embodiment of the present disclosure, each cantilevered member is thus configured to vibrate by lateral bending along a direction perpendicular to the first direction.

According to an embodiment of the present disclosure, said forming at least one cantilevered member comprises providing a starting semiconductor substrate having a first surface.

According to an embodiment of the present disclosure, said forming at least one cantilevered member further comprises forming oxide portions on said starting semiconductor substrate.

According to an embodiment of the present disclosure, said oxide portions are raised with respect to the first surface along the first direction, and are spaced apart to each other along the second direction.

According to an embodiment of the present disclosure, said forming at least one cantilevered member further comprises forming semiconductor portions on portions of exposed surfaces of said oxide portions to define an alternating sequence of recesses and semiconductor portions.

According to an embodiment of the present disclosure, each semiconductor portion is astride two oxide portions and defines a corresponding cavity with said two oxide portions.

According to an embodiment of the present disclosure, each recess has a bottom surface corresponding to an exposed surface portion of an oxide portion and side surfaces corresponding to side surfaces of two semiconductor portions.

According to an embodiment of the present disclosure, said forming at least one cantilevered member further comprises filling said recesses with piezoelectric material.

According to an embodiment of the present disclosure, said forming at least one cantilevered member further comprises forming said at least one cantilevered member by opening vias in the semiconductor portions along said first direction until reaching the cavities.

According to an embodiment of the present disclosure, said filling said recesses with piezoelectric material comprises filling said recesses with piezoelectric material having a crystalline orientation perpendicular to said first direction.

According to an embodiment of the present disclosure, said forming semiconductor portions on portions of exposed surfaces of said oxide portions comprises attaching a semiconductor wafer to said portions of exposed surfaces of said oxide portions through wafer fusion bonding.

According to an embodiment of the present disclosure, said forming semiconductor portions on portions of exposed surfaces of said oxide portions further comprises selectively removing sections of the attached semiconductor wafer.

According to an embodiment of the present disclosure, said filling said recesses with piezoelectric material comprises growing piezoelectric material films on the side surfaces of the silicon portions.

According to an embodiment of the present disclosure, said filling said recesses with piezoelectric material further comprises deposing a layer of piezoelectric material to fill the recesses through reactive sputtering deposition using said piezoelectric material film as seeds.

BRIEF DESCRIPTION OF THE DRAWINGS

These and others features and advantages of the solution according to the present disclosure will be better understood by reading the following detailed description of an embodiment thereof, provided merely by way of non-limitative example, to be read in conjunction with the attached drawings. On this regard, it is explicitly intended that the drawings are not necessarily drawn to scale (with some details thereof that can be exaggerated and/or simplified) and that, unless otherwise stated, they are simply used for conceptually illustrating the described structures and procedures. Particularly.

DETAILED DESCRIPTION

Figure 1A:
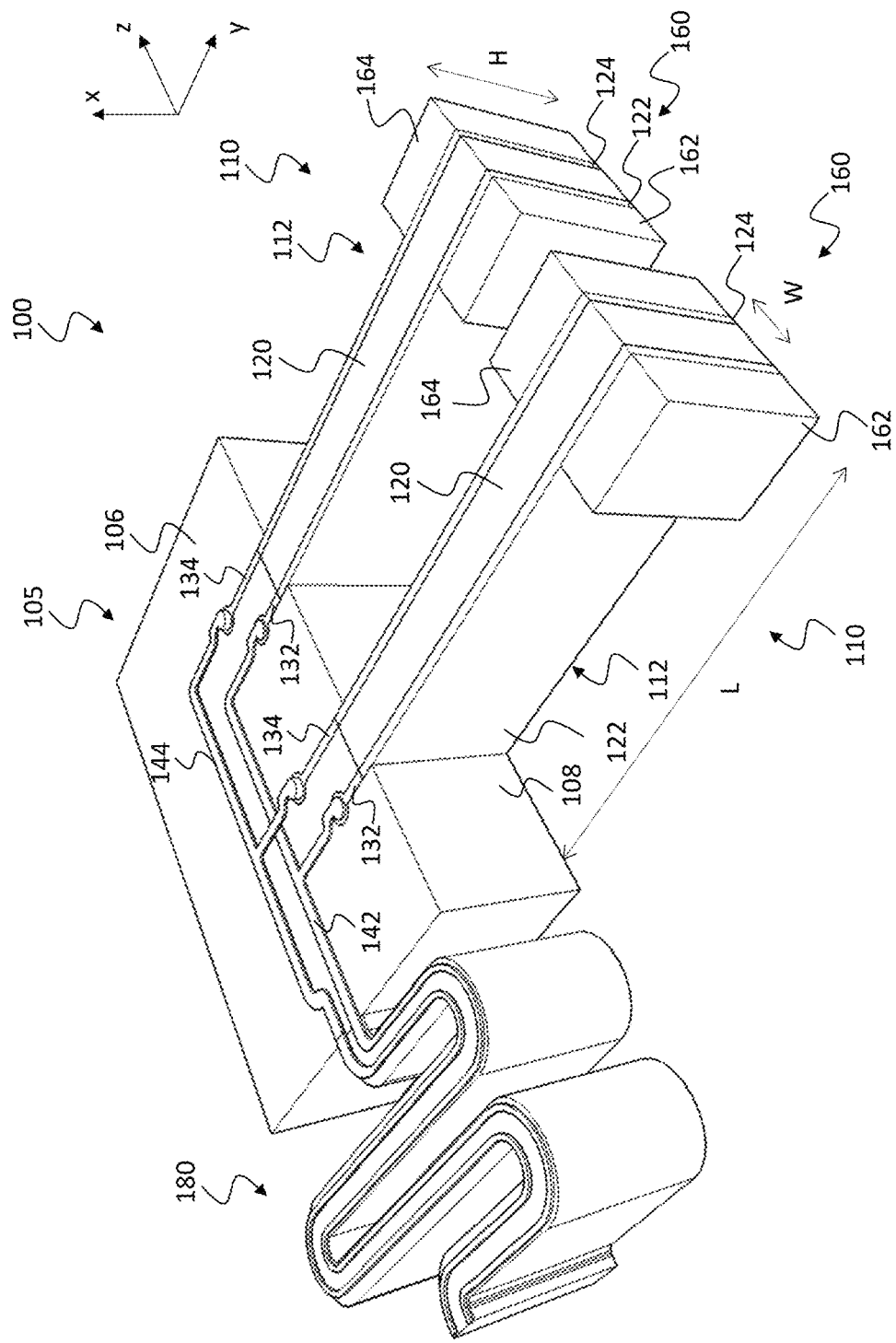
FIGS. 1A and 1B schematically illustrate a PEH device according to an embodiment of the present disclosure.
Figure 1B:
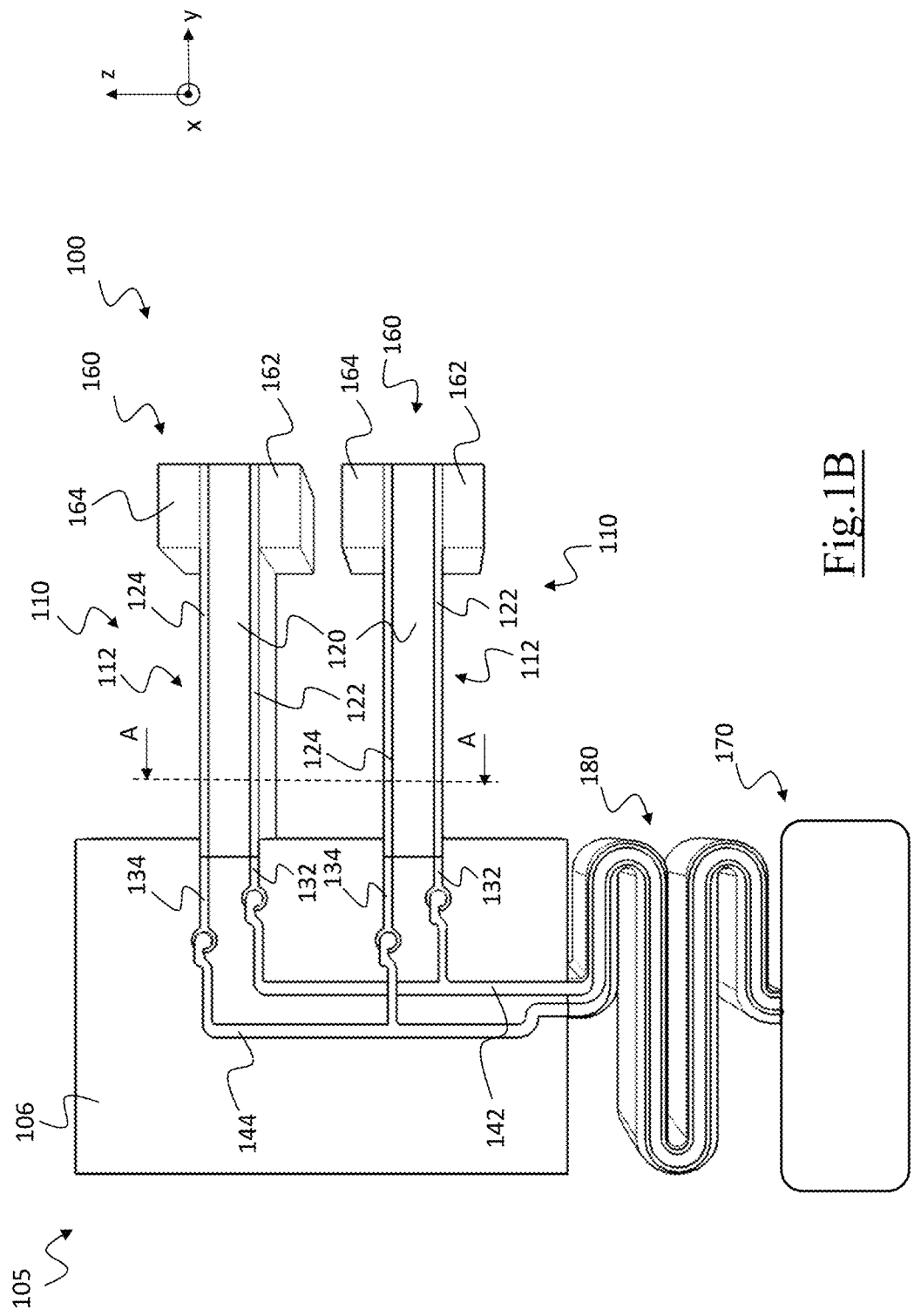

FIGS. 1A and 1B schematically illustrate a (portion of a) PEH device, globally identified with reference 100, according to an embodiment of the present disclosure. In the following of the present description, direction terminology (such as for example, top, bottom, higher, lower, lateral, central longitudinal, transversal, vertical) will be only used for describing the PEH device 100 in relation to the very specific orientation illustrated in the figures, and not for describing possible specific orientation the PEH device 100 will have during its operation.

On this regard, a reference direction system is shown including three orthogonal directions X, Y, Z.

FIG. 1A is a simplified perspective view of a portion of the PEH device 100 according to an embodiment of the present disclosure, while FIG. 1B is a top view of the portion of the PEH device 100 of FIG. 1A parallel to directions Y and Z.

According to an embodiment of the present disclosure, the PEH device 100 comprises a semiconductor substrate 105, e.g., a silicon substrate, having a main surface 106 extending perpendicular to direction X, and side surfaces 108 that extend parallel to directions X and Z. By main surface 106 of the semiconductor substrate 105 it is herein intended the active surface of the substrate, i.e., the surface thereof wherein most of the electric and electronic components, as well conductive tracks, contacts and insulation elements, are integrated. The main (or active) surface is the surface of the substrate that is normally exposed and subjected to the lithographic operations (deposition, etching, growth, implantation) during the manufacturing process of the device. The area of the main surface 106 (and therefore of the opposite surface) is normally much larger than the area of any of the side surfaces 108.

According to an embodiment of the present disclosure, the PEH device 100 comprises one or more (in the example at issue, two) cantilevered members 110 which protrude from the semiconductor substrate 105 and are configured to move (i.e., vibrate) with respect to the latter.

According to an embodiment of the present disclosure, each cantilevered member 110 comprises a body portion 112 having a first end connected to a side surface 108 of the semiconductor substrate 105 and a second free end. The body portion 112 extends from the first end to the second end along the direction Y.

According to an embodiment of the present disclosure, the body portion 112 has a length L along the direction Y that is larger than its height H along the direction X.

According to an embodiment of the present disclosure, the body portion 112 has the height H along the direction X that is higher than its width W along the direction Z.

According to an embodiment of the present disclosure, the height H of the body portion 112 corresponds (e.g., it is substantially equal) to the thickness of the semiconductor substrate 105 along the direction X. In this way, the body portion 112 substantially extends along the direction X for the entire side surface 108.

According to an embodiment of the present disclosure, the body portion 112 comprises three different layers parallel to the directions X and Y and stacked to each other along direction Z. According to an embodiment of the present disclosure, these layers comprise a central layer 120 made of a piezoelectric material, such as aluminum nitride (AlN), between two collector layers 122, 124 comprising a conductive material, such as a conductive semiconductor material (e.g., silicon comprising p-doped silicon regions).

According to the embodiments of the present disclosure, the body portions 112 of each cantilevered member 110 are configured to bend and move (i.e., vibrate) with respect to the semiconductor substrate 105 when the PEH device 100 moves. Thanks to the peculiar ratio among the length L, width W, and height H of the body portions 112—i.e., L>H>W-, according to the embodiments of the present disclosure, each body portion 112 is configured to vibrate, about an equilibrium position in which the body portion 112 is perpendicular to the side surface 108 of the semiconductor substrate 105 (i.e., the one illustrated in the figures), at a corresponding resonance frequency by lateral bending along a direction perpendicular to the direction X. In other words, the body portions 112 are configured to vibrate along a direction parallel to the main surface 106 of the semiconductor substrate 105. This kind of vibration is also referred to as "in-plane vibration", in the sense that the body portions 112, and therefore the cantilevered members 110, do not intersect a plane comprising the main surface 106 of the semiconductor substrate 105 when they vibrate.

According to an exemplary embodiment of the present disclosure, the height H of the body portions 112 may range from 10 to 50 μm.

According to an exemplary embodiment of the present disclosure, the width W of the body portions 112 may range from 2 to 4 μm.

According to an exemplary embodiment of the present disclosure, the length L of the body portions 112 may range from 1000 to 5000 μm.

According to an embodiment of the present disclosure, the ratio of the length L to the height H of the body portions 112 may be equal to or higher than 1000.

These values are feasible with the present MEMS technology, as shown, for example, in *Journal of Microelectromechanical System*, Vol. 20, N5, October 2011.

According to an embodiment of the present disclosure, each cantilevered member 110 is provided with two conductive (e.g., metallic) tracks 132, 134 electrically coupled to the piezoelectric material 120 of the corresponding body portion 112 at spaced apart regions of the piezoelectric material spaced apart along the direction Z. According to an embodiment of the present disclosure, each conductive track 132 contacts the collector layer 122 of the corresponding body portion 112, and each conductive track 134 contacts the collector layer 124 of the corresponding body portion 112.

In operation, when the central layer 120 made of a piezoelectric material bends, a corresponding voltage difference develops across the conductive tracks 132, 134 of the cantilevered member 110.

According to an embodiment of the present disclosure, each one of the conductive tracks 132, 134 extends parallel to the direction Y along a top surface (i.e., a surface parallel to directions Y and Z) of a respective collector layer 122, 124 of the cantilevered member 110.

According to an embodiment of the present disclosure, the cantilevered members 110 of the PEH device 100 are electrically connected in parallel to each other, with the conductive tracks 132 of each cantilevered member 110 that are connected to a same first common conductive track 142 and the conductive tracks 134 of each cantilevered member 110 that are connected to a same second common conductive track 144. According to an embodiment of the present disclosure, the first and second common conductive tracks 142, 144 extend along the main surface 106 of the semiconductor substrate 105.

According to an embodiment of the present disclosure, the piezoelectric material forming the central layers 120 of the body portions 112 advantageously has a crystalline orientation aligned along the direction of the body portions 112 in-plane vibration. According to an embodiment of the present disclosure, the crystalline orientation of the piezoelectric material is perpendicular to the two collector layers 122, 124—i.e., when the body portion 112 is not oscillating, parallel to direction Z. In this way, when the body portion 112 vibrates parallel to the main surface 106 of the semiconductor substrate 105, the piezoelectric material forming the central layers 120 bends along its crystalline orientation, thus increasing the conversion efficiency.

Compared to known solutions, in which the piezoelectric material comprised in the body portion of the cantilevered member is in the form of a thin (along direction X) layer parallel to directions Y and Z, and therefore subjected to unwanted upward or downward bending, the cantilevered members 110 according to the embodiments of the present disclosure have body portions 120 in which the piezoelectric material is in the form of a thick (along direction X) layer parallel to directions (X and Y), and therefore is not (or at least is less) subjected to unwanted upward or downward bending. Therefore, compared to the known solution, according to the embodiments of the present disclosure, it is possible to provide longer (along direction Y) body portions 120, reducing thus the resonance frequency of the vibration and consequently increasing the conversion efficiency of the PEH device 100.

According to an embodiment of the present disclosure, each cantilevered member 110 further comprises a seismic mass portion 160 located at a free end of the body portion 112 (i.e., the end thereof opposite to the one connected to the side surface 108 of the semiconductor substrate 105). According to an embodiment of the present disclosure, the seismic mass portion 160 is made of a semiconductor material, such as silicon. According to an embodiment of the present disclosure, the seismic mass portion 160 comprises a first sub-portion 162 connected to an exposed surface (i.e., not contacting the central layer 120) of the collector layer 122 and a second sub-portion 164 connected to an exposed surface (i.e., not contacting the central layer 120) of the collector layer 124.

According to an embodiment of the present disclosure, the first sub-portion 162 extends, along direction X, for the entire thickness of the collector layer 122. According to an embodiment of the present disclosure, the second sub-portion 164 extends, along direction X, for the entire thickness of the collector layer 124.

The resonance frequency of the body portion 112 vibration strongly depends on the mass of the seismic mass portion 160.

Compared to the known solutions, in which the use of a seismic mass force to reduce the aspect ratio (e.g., the length) of the body portions of the cantilevered member to avoid bending on the piezoelectric layer that negatively affect the conversion efficiency, the peculiar structure of the body portion 112 according to the embodiments of the disclosure, with a thick (along direction X) layer of piezoelectric material, is able to support larger seismic mass portion 160 having larger masses, reducing thus the resonance frequency of the vibration—such as bringing it in the ambient vibration frequency range, i.e., lower than 1 KHz—and consequently increasing the conversion efficiency of the PEH device 100.

According to an embodiment of the present disclosure, the semiconductor substrate 105 is movably coupled to a fixed substrate (schematically illustrated in FIG. 1B with reference 170) of the PEH device 100 by means of an elastic support structure 180, such as, for example, a spring member.

In operation, when the PEH device 100 moves or vibrate or is subjected to variable accelerations, the cantilevered members 110, and particularly the body portions 112 thereof, starts to vibrate along a direction perpendicular to the direction X (in-plane vibration).

According to an embodiment of the present disclosure in which the PEH device 100 comprises a plurality of cantilevered members 110, each body portion 112 starts to vibrate at the resonance frequency, generating a corresponding AC signal across the corresponding collector layers 122, 124—and thus across the corresponding conductive tracks 132, 134.

During a starting transition period, each cantilevered member 110 generally vibrate independently from the other cantilevered members 110. Therefore, the various AC signals generated by the various cantilevered members 110 will oscillate out of phase to each other, and no useful signal across the common conductive tracks 142, 144 can be collected because of destructive interference.

Since all the cantilevered members 110 are connected to a same semiconductor substrate 105 that is in turn movably coupled to the fixed substrate 170 by means of an elastic support structure 180, the semiconductor substrate 105 oscillates as well, synchronizing in turn the vibration of all the cantilevered members 110 according to the known "chaotic synchronization principle" (see, for example, "*Synchronization of coupled mechanical oscillators in the presence of noise and parameter mismatch*" by Anna Karmazyn, Lodz University of Technology, Faculty of Mechanical Engineering, Division of Dynamics, 2014).

In this way, after the starting transition period is expired, an AC signal is collected across the common conductive tracks 142, 144 which is proportional to the number of cantilevered members 100 included in the PEH device 100. Moreover, since the cantilevered members 110 vibrates in a synchronous way, there is no need of a rectifier circuit for each cantilevered member 110 (for rectifying the signal generated by the single cantilevered member 110 across its corresponding conductive tracks 132, 134), but rather it is sufficient to provide a single rectifier circuit for rectifying the signal across the common conductive tracks 142, 144.

According to an embodiment of the present disclosure, the common conductive tracks 142, 144 cross the elastic support structure 180 for reaching the fixed substrate 170.

According to an alternative embodiment of the present disclosure (not illustrated), a multi-frequency PEH device 100 can be provided, in which some or each of the cantilevered members 110 are configured to generate AC signals oscillating at different frequencies by properly setting the ratio among the length L, width W, and height H of the body portion 112 and/or the mass of the seismic mass portion 160 of each cantilevered member 110 in an individual way.

According to an alternative embodiment of the disclosure, the collector layers 122, 124 may comprise a different conductor material, such as a metallic material in form of layers contacting the central layer 120 made of piezoelectric material.

According to other embodiments of the present disclosure, the central layer 120 may comprise piezoelectric materials different from AlN, such as scandium-enriched aluminum nitride (Sc—AlN) or lead zyrconate titanate (PZT).

Figure 2A:
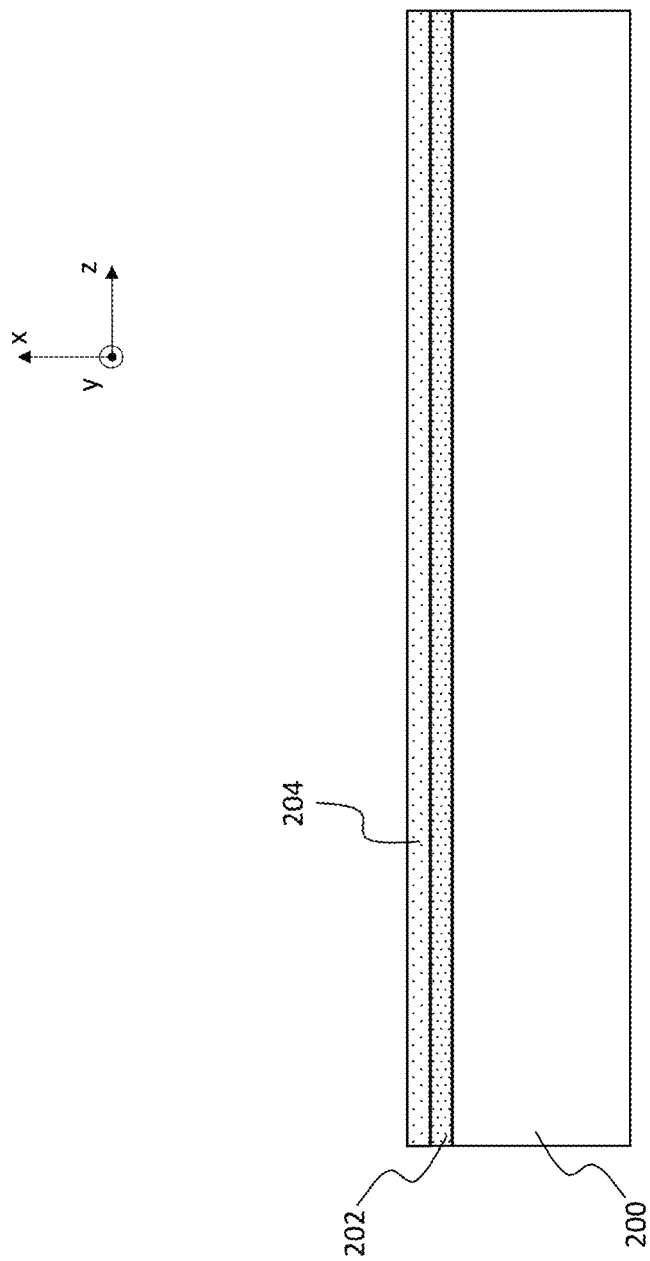
FIGS. 2A-2N illustrate main steps of a method for manufacturing the PEH device of FIGS. 1A and 1B according to embodiments of the present disclosure.
Figure 2B:
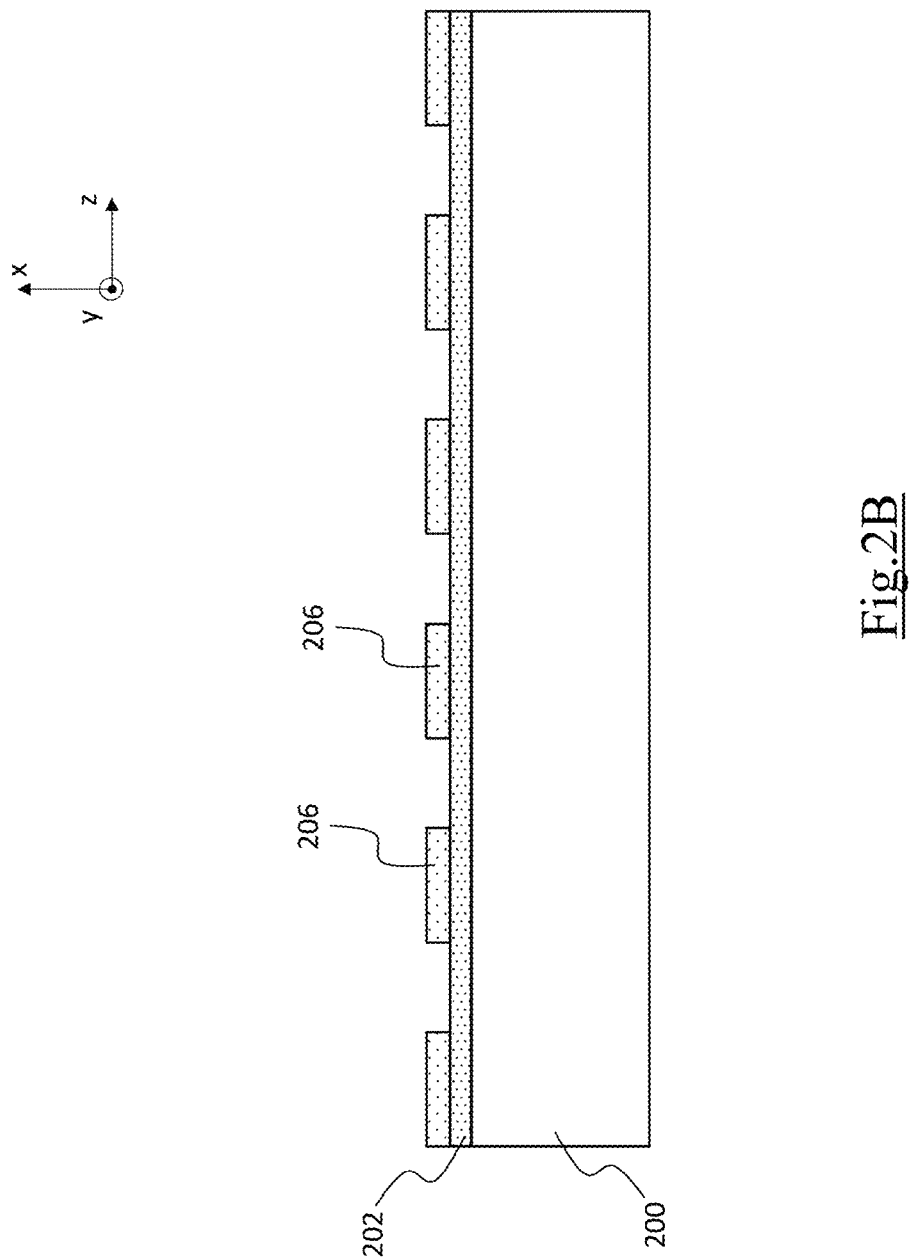
Figure 2C:
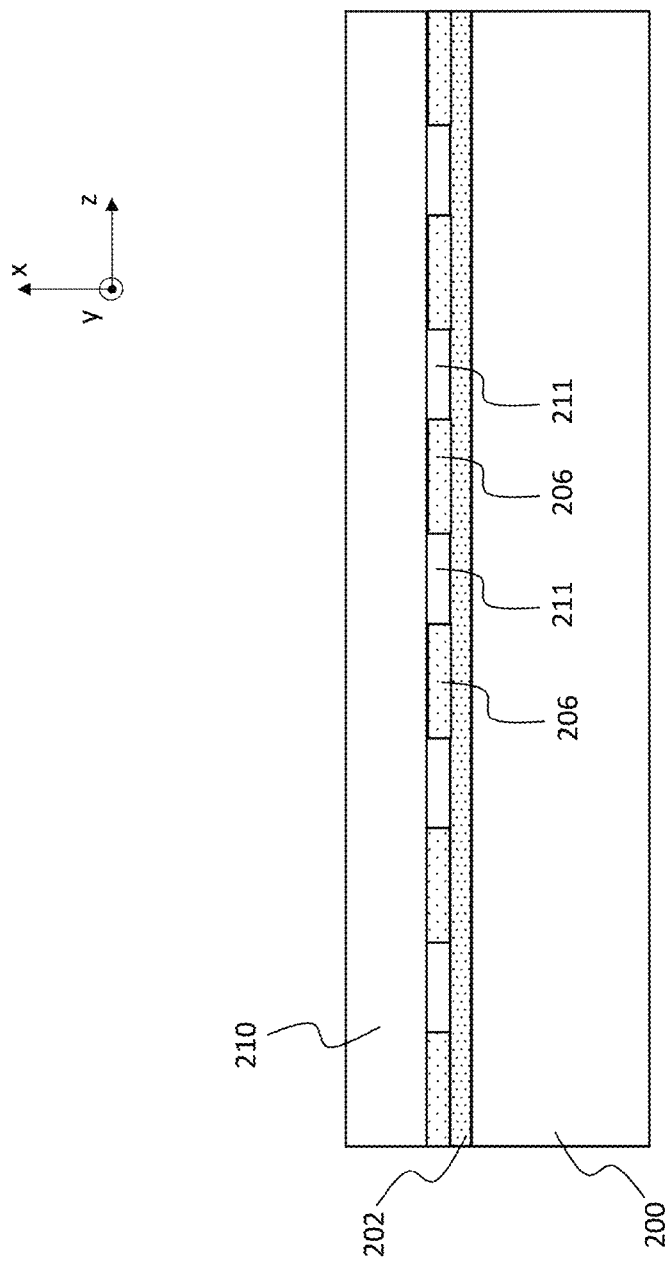
Figure 2D:
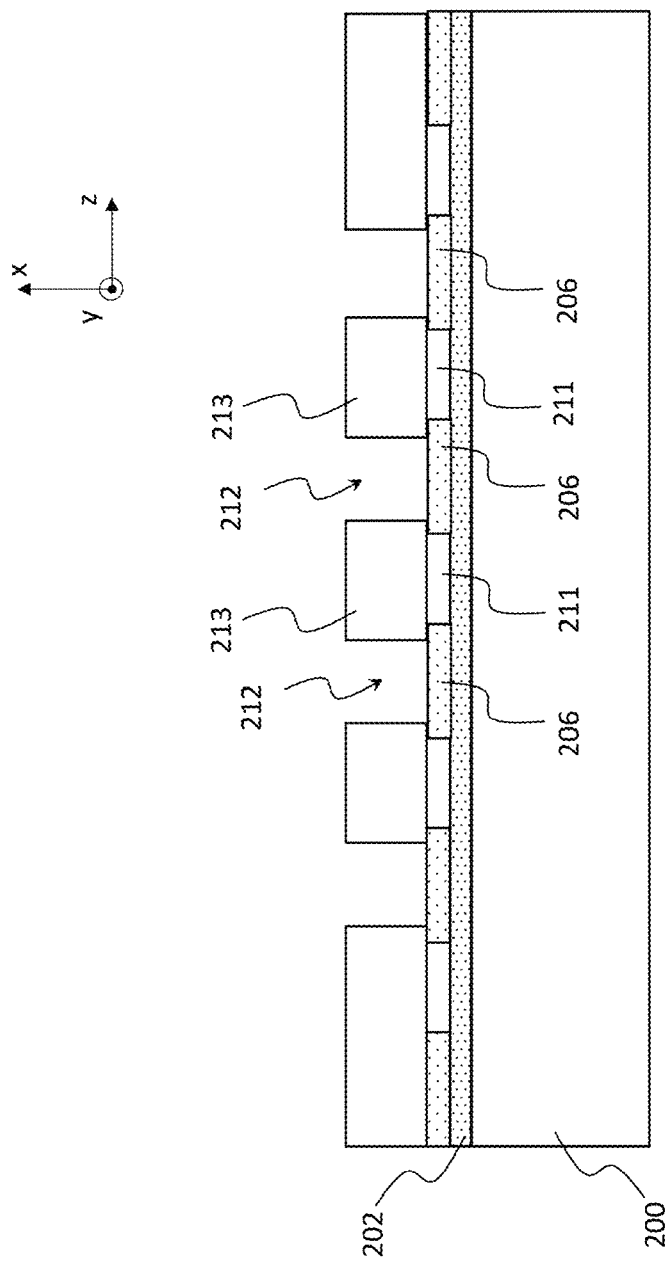
Figure 2E:
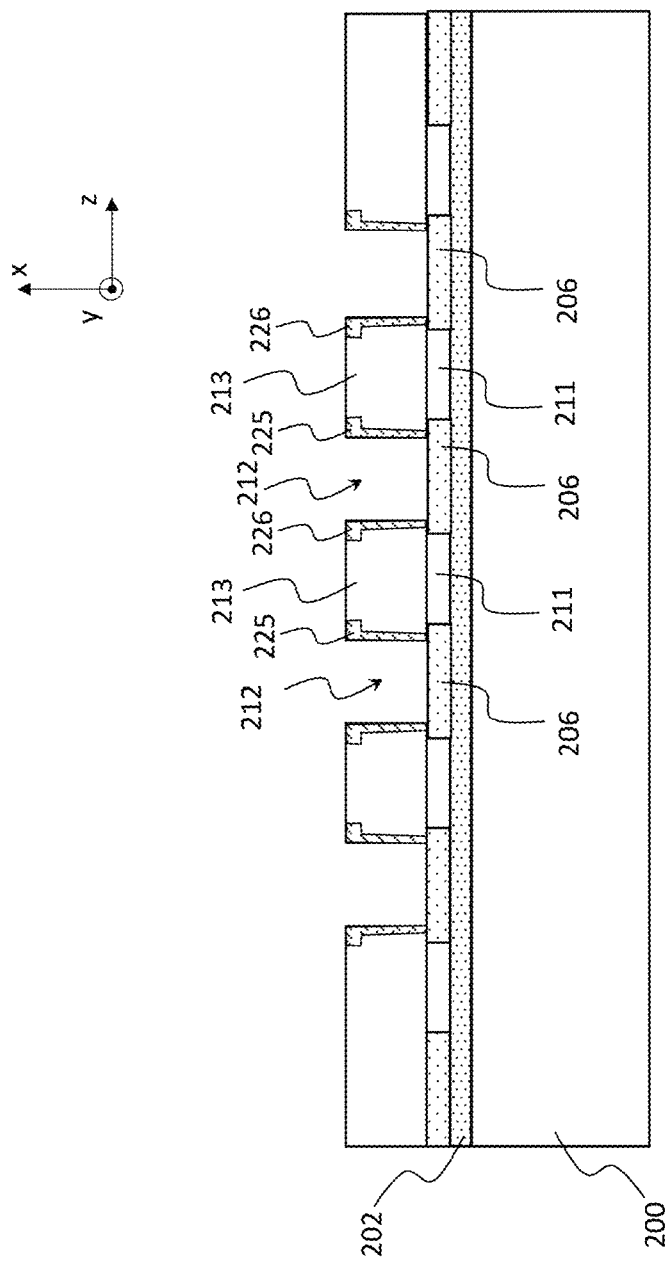
Figure 2F:
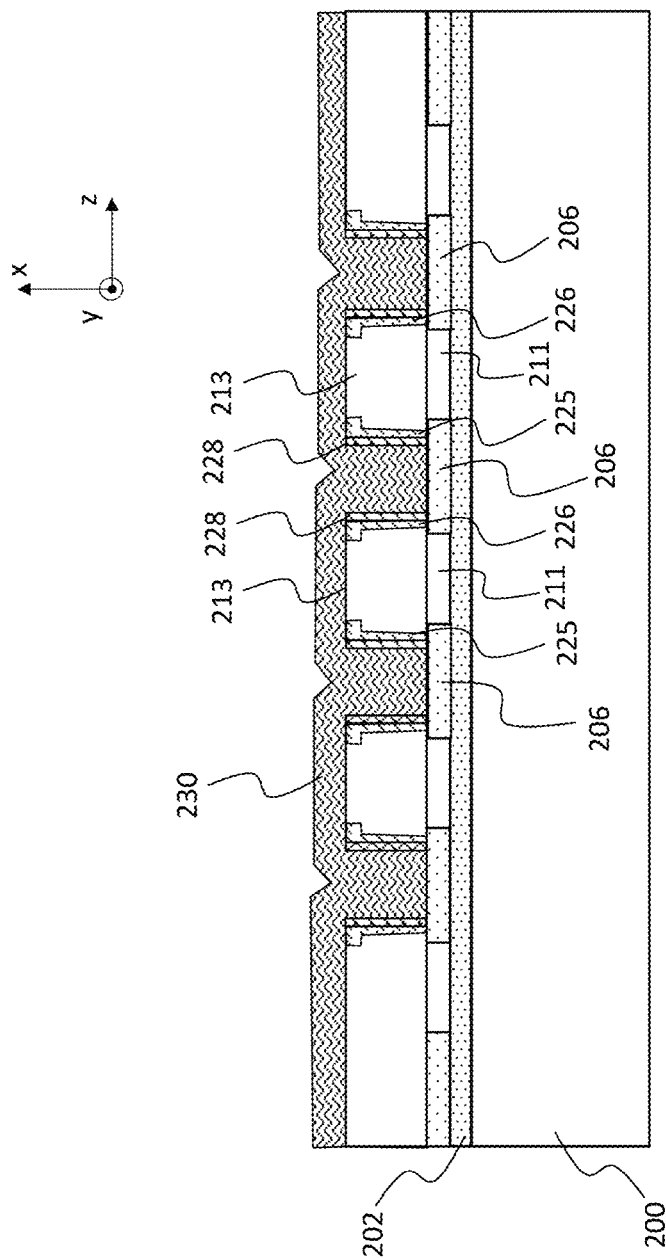
Figure 2G:
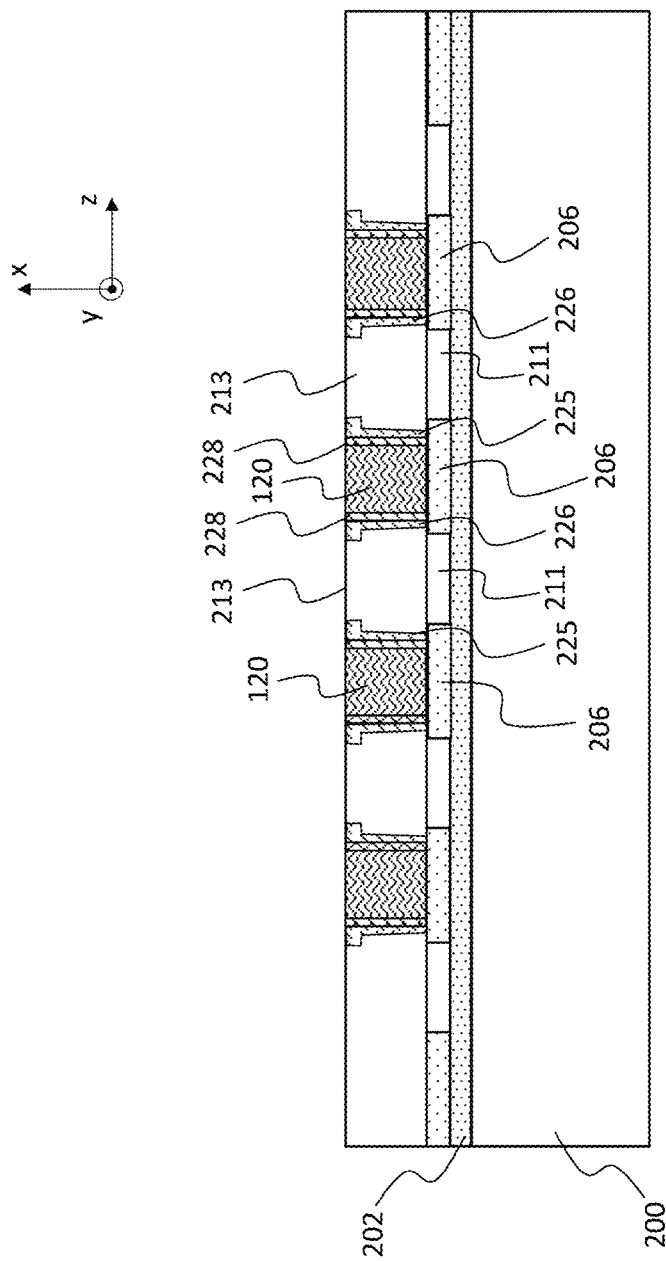
Figure 2H:
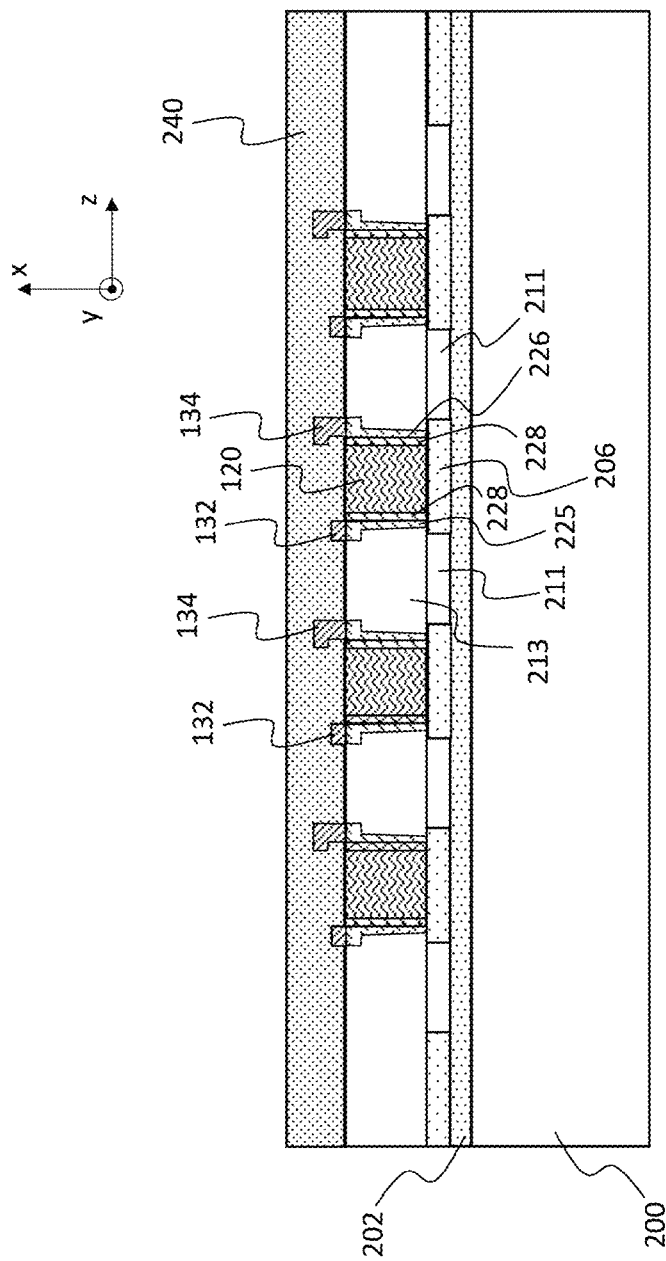
Figure 2I:
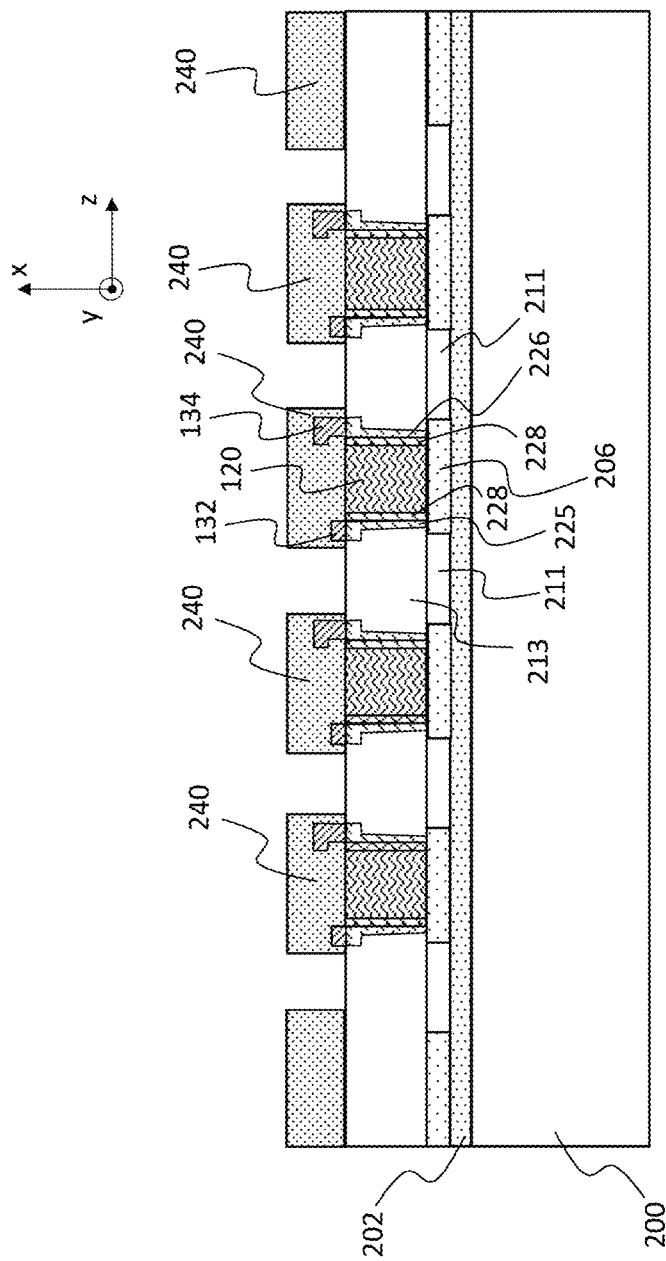
Figure 2J:
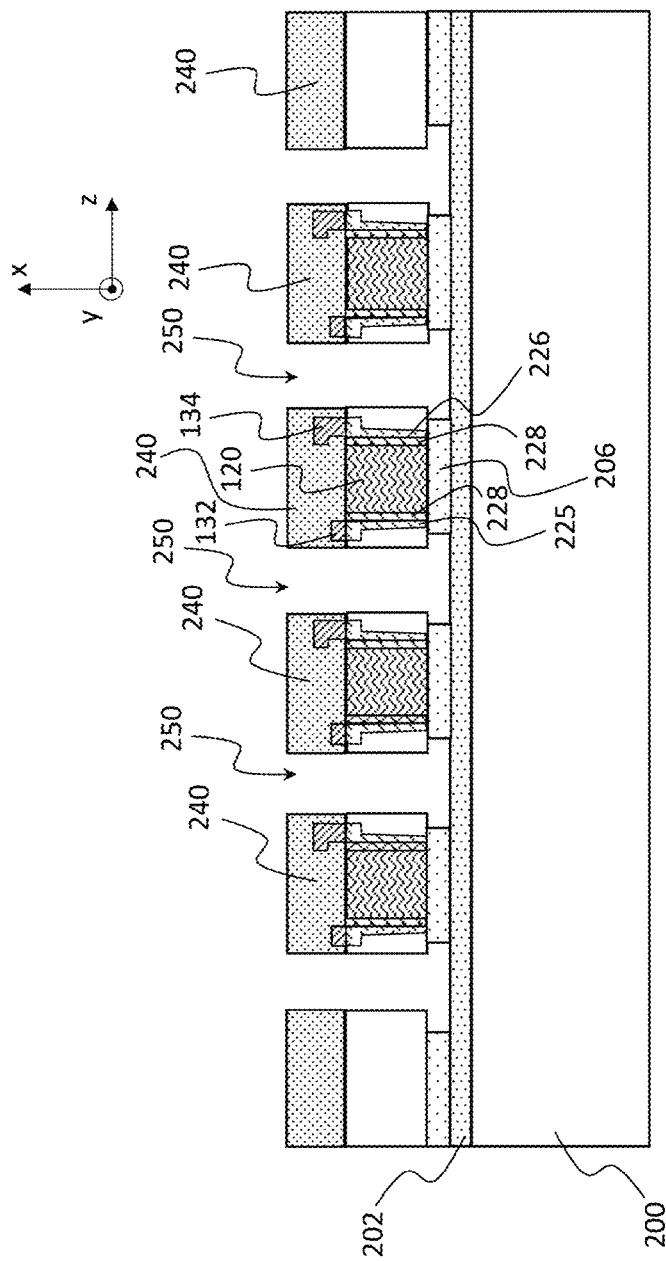
Figure 2K:
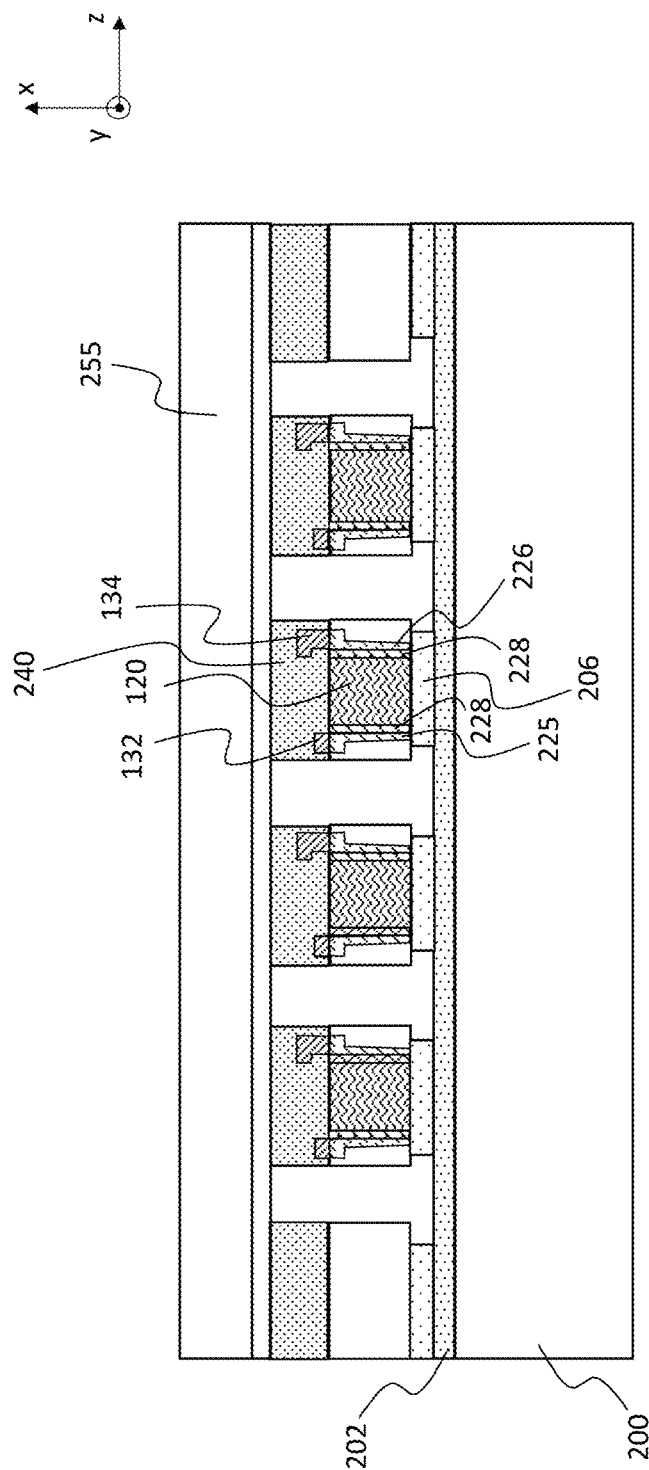
Figure 2L:
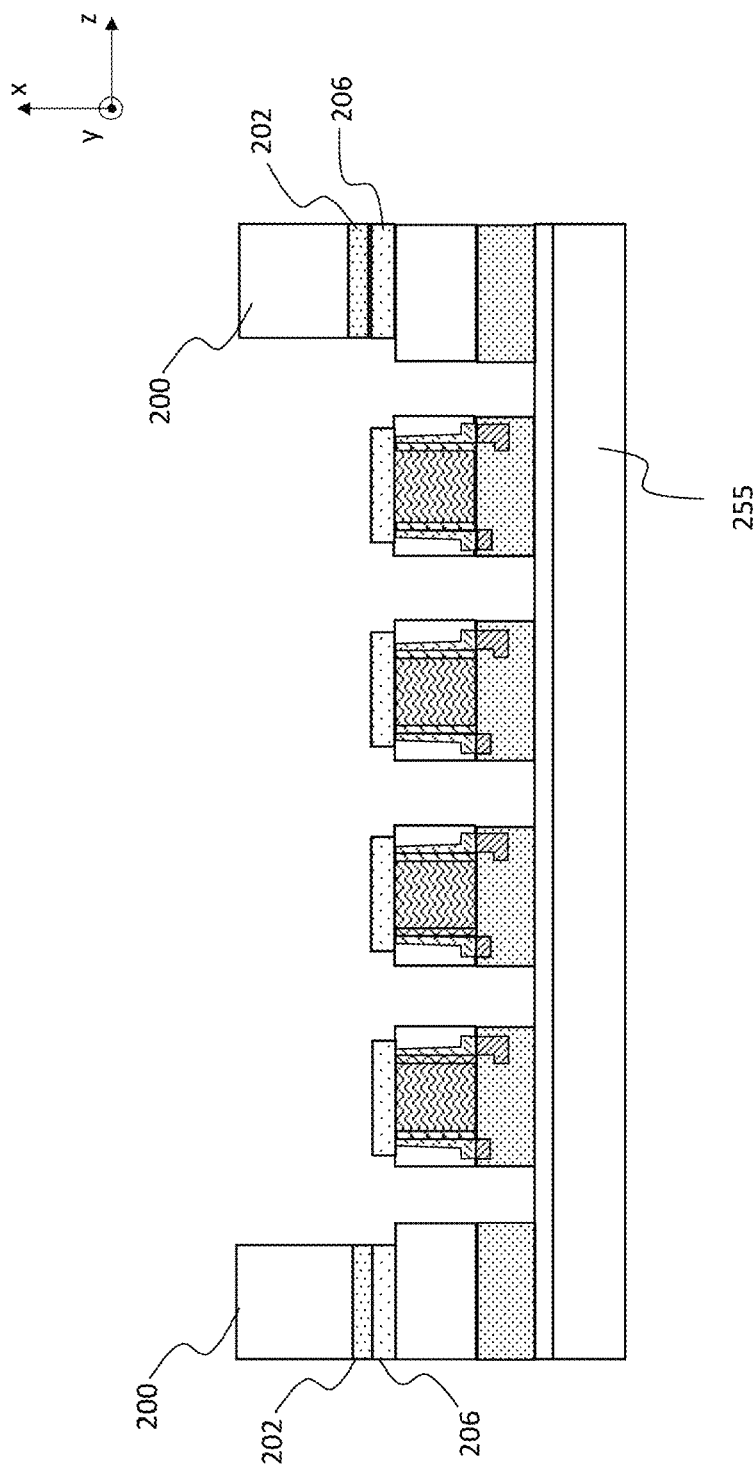
Figure 2M:
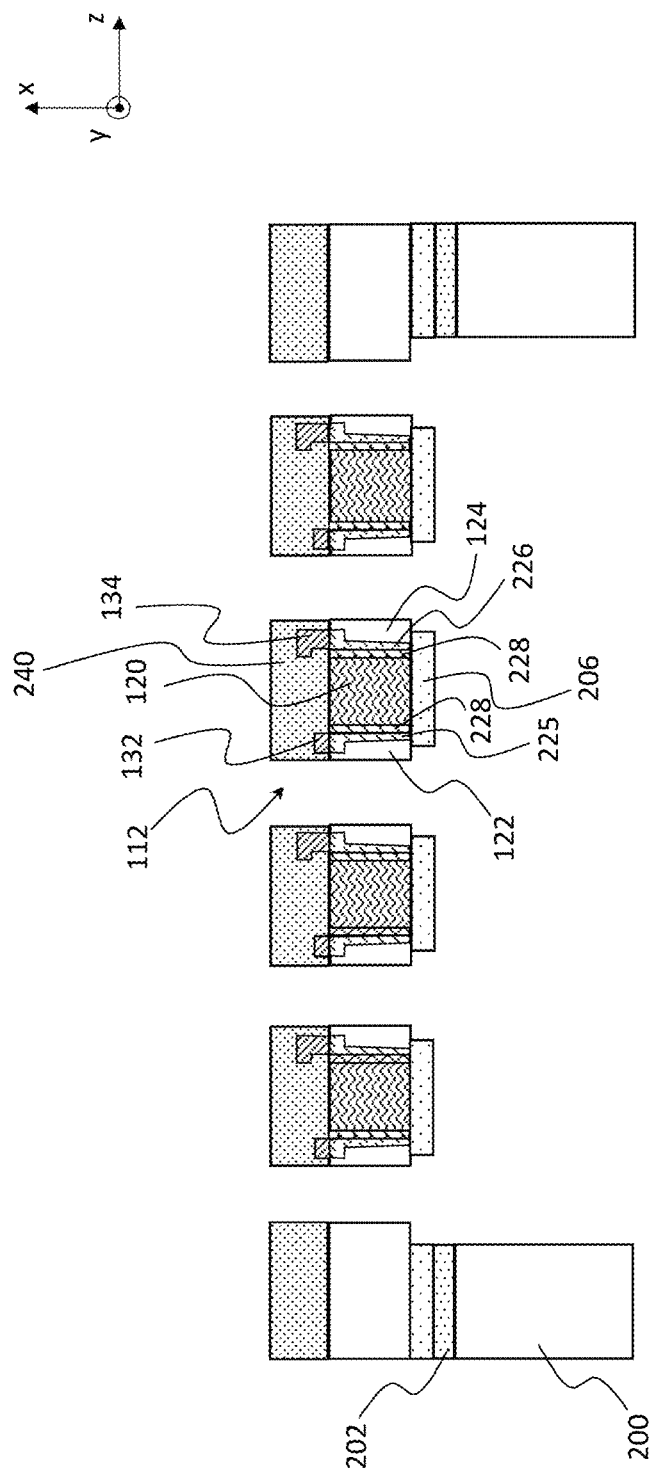
Figure 2N:
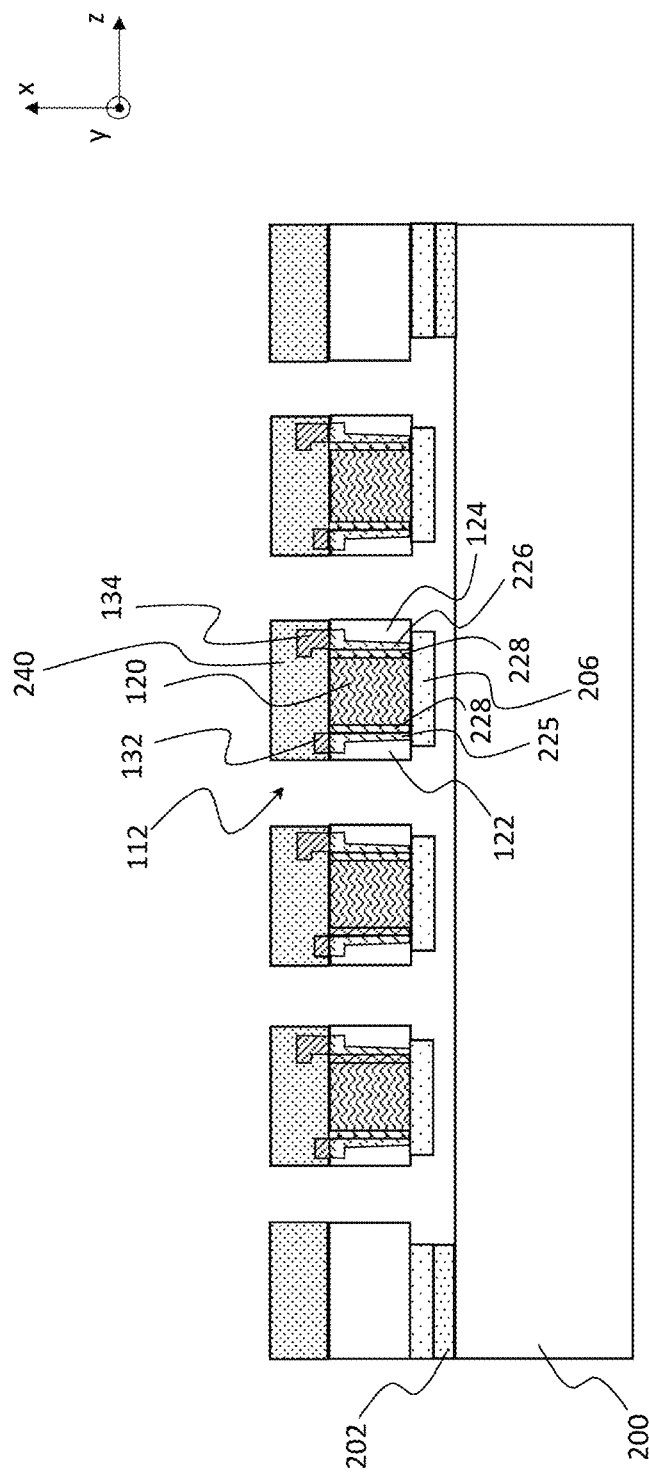

FIGS. 2A-2N illustrate main steps of a method for manufacturing the PEH device 100 of FIGS. 1A and 1B according to embodiments of the present disclosure.

Particularly, FIGS. 2A-2N are cross sectional views of the PEH device 100 during the main steps of the manufacturing method taken along a section plane A-A parallel to the directions X and Z and crossing the body portions 112 of the cantilevered members 110 (see FIG. 1B).

Making reference to FIG. 2A, the manufacturing process according to an embodiment of the present disclosure starts by providing a semiconductor (e.g., silicon) substrate 200, forming an oxide layer 202, such as silicon dioxide ($SiO_2$) over a top surface of the semiconductor substrate 200, and then deposing an aluminum oxide ($Al_2O_3$) layer 204 on the oxide layer 202. For example, the oxide layer 202 may be formed by thermally oxidizing the surfaces of the semiconductor substrate 200 and then selectively removing the growth oxide from the side and bottom surfaces of the semiconductor substrate 200.

According to an embodiment of the present disclosure illustrated in FIG. 2B, the next phase of the manufacturing process according to an embodiment of the present disclosure provides for selectively removing sections of the aluminum oxide layer 204 until exposing the underlying oxide layer 202 in order to define a plurality of separated aluminum oxide portions 206 spaced apart to each other along the direction Z.

Making reference to FIG. 2C, the following phase of the manufacturing process according to an embodiment of the present disclosure provides for attaching a silicon wafer 210 on the exposed surfaces of the aluminum oxide portions 206, so as to form cavities 211 between adjacent aluminum oxide portions 206. According to an embodiment of the present disclosure, this phase is carried out by means of a silicon wafer fusion bonding procedure, such as the one disclosed in "*Direct Bonding of Oxidized Cavity Wafers*" by M. Palokangas, J. Dekker, K. Henttinen and J. Makinen, ECS Transactions, 16 (8) 457-463 (2008), or in "*Silicon-on-Insulator Wafers with Buried Cavities*" by T. Suni, K. Henttinen, J. Dekker, H. Luoto, M. Kulawski, J. Makinen and R. Mutikainen, Journal of the Electrochemical Society, 153 (4) G299-G303 (2006).

According to an embodiment of the present disclosure illustrated in FIG. 2D, the next phase of the manufacturing process according to an embodiment of the present disclosure provides for selectively removing sections of the attached silicon wafer 210 at selected aluminum oxide portions 206 until exposing portions of surfaces of said aluminum oxide portions 206. In this way, an alternating sequence of recesses 212 and silicon portions 213 (each one astride two respective oxide portions 260) is formed along direction Z, with each recess 212 having a bottom surface corresponding to an exposed surface portion of a corresponding aluminum oxide portion 206 and side surfaces corresponding to side surfaces of two silicon portions 213.

For example, this phase may comprise carrying out dry etching followed by silicon vertical wall planarization (for example, through a scallop erase technique or using tetramethylammonium hydroxide (TMAH)). As it will be described in the following, the recesses 212 will be used to define the piezoelectric material central layers 120 of the body portions 112 of the cantilevered members 100, while parts of the silicon portions 213 will form the collector layers 122, 124.

Making reference to FIG. 2E, the following phase of the manufacturing process according to an embodiment of the present disclosure provides for implanting doping impurities (e.g., of the p type) into side surfaces of the silicon portions 213 surrounding each recess 212 for modifying their conductivity. In this way, for each recess 212 a corresponding first implanted region 225 and a second implanted region 226 are formed in the two silicon portions 213 surrounding said recess 212. According to another embodiment of the present disclosure, instead of forming the first implanted region 225 and a second implanted region 226, a metal layer is deposed so as to cover the side surfaces of the silicon portions 213 surrounding each recess 212.

As it is illustrated in FIG. 2F, according to an embodiment of the present disclosure, after a thin film 228 of piezoelectric material, e.g., AlN, is grown on the doped side surfaces of the silicon portions 213, the next phase provides for deposing a layer 230 of piezoelectric material, e.g., AlN, to fill the recesses 212. Other usable piezoelectric materials may comprise Sc—AlN and PZT.

According to an embodiment of the present disclosure, the layer 230 is deposed using a reactive sputtering deposition procedure using the thin films 228 as seeds. For example, the layer 230 can be deposed according to the deposition technique described in "*From the Bottom-Up: toward Area-Selective atomic Layer Deposition with High Selectivity*" by Adriaan J. M. MAckus, Marc J. M. Merkx, and Wilhelmus M. M. Kessels, Chemistry of Materials 2019 31 (1), 2-12.

Alternative methods for deposing the layer 230 may comprise Physical Vapor Deposition (PVD) or Chemical Solution Deposition (CSD).

Since the piezoelectric material of the layer 230 filling the recesses 212 will form the central layers 120 of the body portions 112 configured to oscillate by an in-plane vibration, according to an embodiment of the present disclosure the layer 230 is deposed in such a way to have a crystalline orientation aligned along direction Z (i.e., aligned with the in-plane vibration). Moreover, the crystalline orientation aligned along direction Z allows to increase the mechanical rigidity of the body portions 112, and therefore of the cantilevered elements 110, which are less prone to unwanted bending along direction X.

According to an embodiment of the present disclosure, the layer 230 is deposed with a conformal coverage of the recesses avoiding the formation of voids.

Making reference to FIG. 2G, the next phase of the manufacturing process according to an embodiment of the present disclosure provides for removing (e.g., through dry etching) portions of the deposed layer 230 of piezoelectric material, until exposing top surfaces of the silicon portions 213, so as to define the central layers 120 of the body portions 112 (see FIGS. 1A and 1B). Each central layer 120 is surrounded by a first implanted region 225 of a silicon portion 213 and by a second implanted region 226 of another silicon portion 213.

Without providing details not relevant for the understanding of the present disclosure, and well known to those skilled in the art, according to an embodiment of the present disclosure, the following phase illustrated in FIG. 2H provides for forming the conductive tracks 132, 134 for contacting the collector layers 122, 124 (see FIGS. 1A and 1B). According to an embodiment of the present disclosure, the conductive tracks 132, 134 are formed by metal depositions on dielectric—e.g., silicon nitride (SiN)—layers 240, with said dielectric layers 240 that are properly patterned in such a way that the first implanted regions 225 are electrically connected to the conductive track 132, and the second implanted regions 226 are electrically connected to the conductive track 134. It has to be appreciated that since in the final PEH device 100 the various cantilevered members 110 will be electrically connected in parallel to each other, with the conductive tracks 132 of each cantilevered member 110 that are connected to a same first common conductive track 142 and the conductive tracks 134 of each cantilevered member 110 that are connected to a same second common conductive track 144 (see FIGS. 1A and 1B), the conductive tracks 132 and the conductive tracks 134 are advantageously formed at two different heights along the direction X. In the illustrated example, the conductive tracks 132 are formed at a lower height compared to the conductive tracks 134, however similar considerations apply in case conductive tracks 132 are formed at a higher height compared to the conductive tracks 134.

Then, according to an embodiment of the present disclosure illustrated in FIG. 2I, portions of the dielectric layer 240 over (along direction X) the cavities 211 are removed until exposing part of the top surface of each underlying silicon portion 213. According to an embodiment of the present disclosure, this phase is carried out by means of a dry etching procedure.

According to an embodiment of the present disclosure illustrated in FIG. 2J, vias 250 are opened in the silicon portions 213 through dry etching using the patterned dielectric layer 240 as a mask until reaching the underlying cavities 211. The remaining parts of the silicon portions 213 surrounding each central layer 120 (and comprising the first and second implanted regions 225, 226) form the collector layers 122, 124 of the body portion 112 including said central layer 120.

According to an embodiment of the present disclosure, in order to form the body portions 112 of the cantilevered members 110 and obtain the final PEH device 100, the following final phases are carried out after the phase illustrated in FIG. 2J:
 a further silicon wafer 255 is temporary bonded to the (remaining portions of the) patterned dielectric layer 240 (see FIG. 2K);
 the structure so far obtained is turned upside-down in such a way that a bottom surface of the semiconductor substrate 200 is facing upward;
 a dry etching operation is carried out for removing a portion of the semiconductor substrate 200 from the now exposed surface and a corresponding portion of the oxide layer 202 until reaching the cavities 211 and exposing the aluminum oxide portions 206 (see FIG. 2L);
 the structure so far obtained is turned upside-down again, the further silicon wafer 255 is de-bonded and removed, so as to form the body portions 112 of the cantilevered members 110 and obtain the final PEH device 100 (see FIG. 2M).

According to an alternative embodiment of the present disclosure illustrated in FIG. 2N, the body portions 112 of the cantilevered members 110 are formed without requiring a temporary bonding of an additional silicon wafer and without requiring upside-down turn operations, but rather by removing a portion of the oxide layer 202 under the aluminum oxide portions 206 and under the aluminum oxide portions 206 through vapor or liquid hydrofluoric acid (HF).

Figure 3:
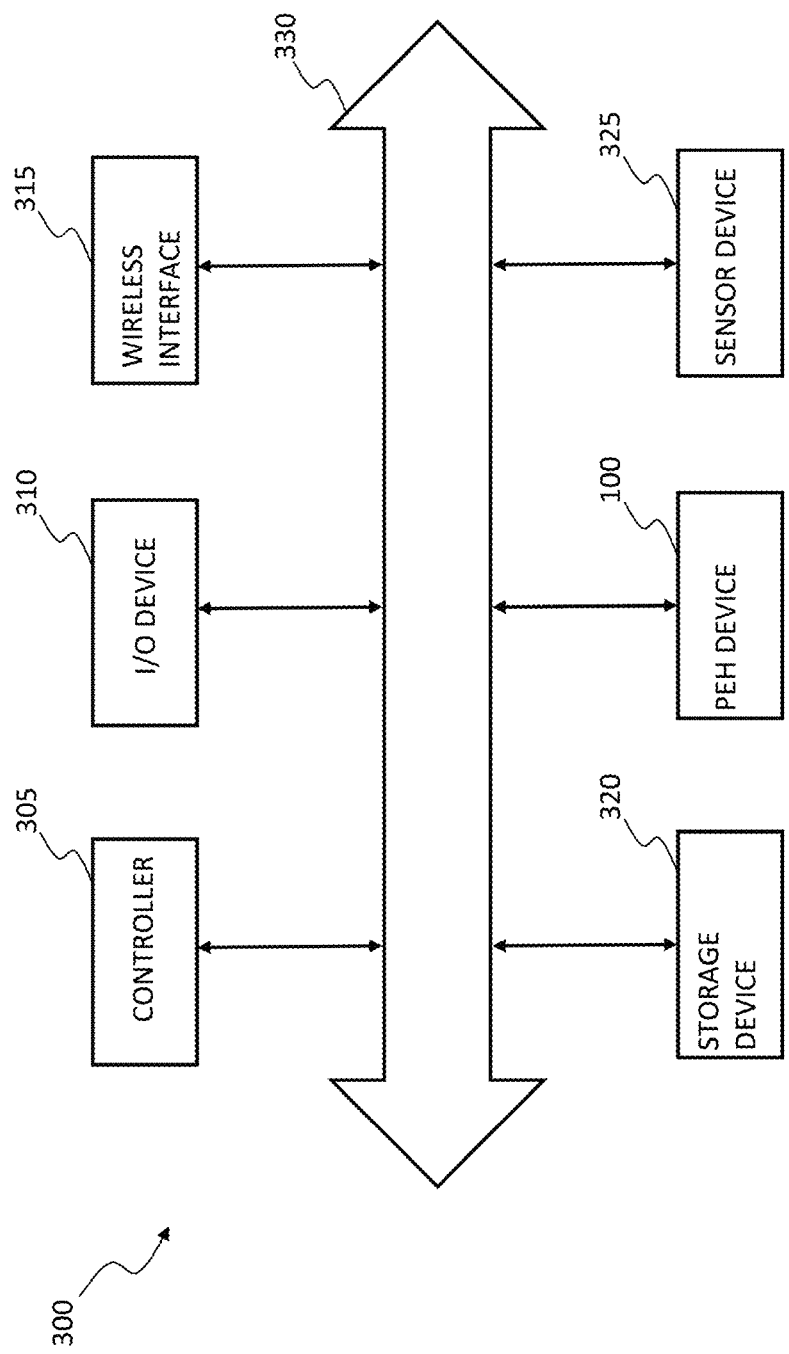
FIG. 3 illustrates in terms of simplified blocks an electronic system comprising at least one PEH device of FIGS. 1A and 1B according to embodiments of the disclosure.

FIG. 3 illustrates in terms of simplified blocks an electronic system 300 (or a portion thereof) comprising at least one PEH device 100 according to the embodiments of the disclosure described above.

According to an embodiment of the present disclosure, the electronic system 300 is an electronic device for low power applications, such as, for example, an IoT sensing node adapted to be powered by the PEH device 100.

According to an embodiment of the present disclosure, the electronic system 300 may comprise, in addition to the PEH device 100, a controller 305, such as, for example, one or more microprocessors and/or one or more microcontrollers.

According to an embodiment of the present disclosure, the electronic system 300 may comprise, in addition to the PEH device 100, an input/output device 310 (such as, for example, a keyboard, and/or a touch screen and/or a visual display) for generating/receiving messages/commands/data, and/or for receiving/sending digital and/or analogic signals.

According to an embodiment of the present disclosure, the electronic system 300 may comprise, in addition to the PEH device 100, a wireless interface 315 for exchanging messages with a wireless communication network (not shown), for example, through radiofrequency signals. Examples of wireless interface 315 may comprise antennas and wireless transceivers.

According to an embodiment of the present disclosure, the electronic system 300 may comprise, in addition to the PEH device 100, a storage device 320, such as, for example, a volatile and/or a non-volatile memory device.

According to an embodiment of the present disclosure, the electronic system 300 may comprise, in addition to the PEH device 100, a sensor device 325, for example, an accelerometer sensor, a temperature sensor, a pressure sensor, or an acoustic sensor.

According to an embodiment of the present disclosure, the electronic system 300 may comprise one or more communication channels (buses) for allowing data exchange between the PEH device 100 and the controller 305, and/or the input/output device 310, and/or the wireless interface 315, and/or the storage device 320, and/or the sensor device 325, when they are present.

Naturally, in order to satisfy local and specific requirements, a person skilled in the art may apply to the solution described above many logical and/or physical modifications and alterations. More specifically, although the present disclosure has been described with a certain degree of particularity with reference to preferred embodiments thereof, it should be understood that various omissions, substitutions and changes in the form and details as well as other embodiments are possible. In particular, different embodiments of the disclosure may even be practiced without the specific details set forth in the preceding description for providing a more thorough understanding thereof; on the contrary, well-known features may have been omitted or simplified in order not to encumber the description with unnecessary details. Moreover, it is expressly intended that specific elements and/or method steps described in connection with any disclosed embodiment of the disclosure may be incorporated in other embodiments.

For example, although in the present description reference has been mainly made to a PEH device and a manufacturing method thereof, the concepts of the present disclosure can be applied to other kind of MEMS devices comprising cantilevered members comprising piezoelectric material.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A MEMS device, comprising:
a semiconductor substrate including a main surface extending perpendicular to a first direction and a side surface extending on a plane parallel to the first direction and to a second direction, the second direction being perpendicular to the first direction; and
at least one cantilevered member protruding from the side surface of the semiconductor substrate along a third direction perpendicular to the first and second directions, the at least one cantilevered member comprises a body portion including a piezoelectric material, the body portion having a length along the third direction, a height along the first direction and a width along the second direction, the height being greater than the width, the at least one cantilevered member being configured to vibrate by lateral bending along a direction perpendicular to the first direction;
an elastic support structure coupled to the semiconductor substrate; and
one or more conductive tracks aligned with the at least one cantilevered member, the one or more conductive tracks are electrically coupled to the piezoelectric material of the body portion of the cantilever member, and the one or more conductive tracks extend along the elastic support structure.

2. The MEMS device of claim 1, wherein the body portion has a first end connected to the side surface of the semiconductor substrate and a second free end opposite to the first end, the piezoelectric material disposed between two collector layers, the piezoelectric material and each of the two collector layers extending from the first end to the second end of the body portion along the first direction and along the third direction.

3. The MEMS device of claim 2, wherein the body portion includes a seismic mass portion connected to the second end thereof.

4. The MEMS device of claim 1, wherein the piezoelectric material has a crystalline orientation perpendicular to the first direction.

5. The MEMS device of claim 1, wherein the one or more conductive tracks include a first conductive track and a second conductive track electrically coupled to the piezoelectric material of the body portion of the cantilevered member at spaced apart regions of the piezoelectric material spaced apart along the second direction, a corresponding voltage difference developing across the first and second conductive tracks when the at least one cantilevered member vibrates.

6. The MEMS device of claim 5, wherein the at least one cantilevered member includes a plurality of cantilevered members, each of the cantilevered members being aligned with a respective first conductive track and a respective second conductive track electrically coupled to the piezoelectric material of a respective cantilevered member, wherein each of the first conductive tracks is connected to a same first common conductive track, and each of the second conductive tracks is connected to a same second common conductive track.

7. The MEMS device of claim 6, wherein the semiconductor substrate is movably coupled to a fixed substrate by the elastic support structure.

8. The MEMS device of claim 1, wherein the MEMS device is a piezoelectric energy harvester device.

9. An electronic system, comprising:
one or more MEMS devices, each of the one or more MEMS devices including:
a semiconductor substrate including a main surface extending perpendicular to a first direction and a side surface extending on a plane parallel to the first direction and to a second direction, the second direction being perpendicular to the first direction; and
at least one cantilevered member protruding from the side surface of the semiconductor substrate along a third direction perpendicular to the first and second directions, the at least one cantilevered member comprises:
a body portion including:
a piezoelectric material having a first sidewall and a second sidewall opposite to the first sidewall;
a first collector layer on a first sidewall of the piezoelectric material;
a second collector layer on a second sidewall of the piezoelectric material;
a length along the third direction;
a height along the first directions; and
a width along the second direction, the width being less than the height;
a first sub-portion extends outward from the first collector layer and is on the first collector layer, and the first sub-portion is fully separated from the piezoelectric material by the first collector layer; and
a second sub-portion extends outward from the second collector layer and is on the second collector layer, and the second sub-portion is fully separated from the piezoelectric material by the second collector layer; and
wherein the at least one cantilevered member being configured to vibrate by lateral bending along a direction perpendicular to the first direction.

10. The electronic system of claim 9, wherein the body portion has a first end connected to the side surface of the semiconductor substrate and a second free end opposite to the first end, the piezoelectric material, the first collector layer, and the second collector layer extending from the first end to the second free end of the body portion along the first direction and along the third direction.

11. The electronic system of claim 10, wherein the first sub-portion and the second sub-portion of the body portion define a seismic mass portion at the second free end of the body portion.

12. The electronic system of claim 9, wherein the piezoelectric material has a crystalline orientation perpendicular to the first direction.

13. The electronic system of claim 9, wherein the at least one cantilevered member is aligned with a corresponding first conductive track and a second conductive track electrically coupled to the piezoelectric material of the body portion of the cantilevered member at spaced apart regions of the piezoelectric material spaced apart along the second direction, a corresponding voltage difference developing across the first and second conductive tracks when the at least one cantilevered member vibrates.

14. The electronic system of claim 13, wherein the at least one cantilevered member includes a plurality of cantilevered members, each of the cantilevered members being aligned with a respective first conductive track and a respective second conductive track electrically coupled to the piezoelectric material of a respective cantilevered member, wherein each of the first conductive tracks is connected to a same first common conductive track, and each of the second conductive tracks is connected to a same second common conductive track.

15. The electronic system of claim 14, wherein the semiconductor substrate is movably coupled to a fixed substrate by an elastic support structure.

16. The electronic system of claim 9, wherein the one or more MEMS devices is a piezoelectric energy harvester device.

17. A MEMS device, comprising:
a semiconductor substrate including a first surface, a second surface opposite to the first surface, and a side surface that extends from the first surface to the second surface;
a first cantilevered member protrudes from the side surface, the first cantilevered member includes:
   a first free end at which the first cantilevered member terminates;
   a first piezoelectric layer including a third surface, a fourth surface opposite to the third surface, a first sidewall extends from the third surface to the fourth surface and is transverse to the third surface and the fourth surface, and a second sidewall extends from the third surface to the fourth surface, is transverse to the third surface and the fourth surface, and is opposite to the first sidewall, the first piezoelectric layer extends from the side surface of the semiconductor substrate to the first free end;
   a first collector layer on the first sidewall, the first collector layer extends from the side surface of the semiconductor substrate to the first free end;
   a second collector layer on the second sidewall, the second collector layer extends from the side surface of the semiconductor substrate to the first free end;
   a first sub-portion on the first collector layer; and
   a second sub-portion on the second collector layer, the second sub-portion is opposite to the first sub-portion about the first piezoelectric layer, the first collector layer, and the second collector layer.

18. The MEMS device of claim 17, further comprising a second cantilevered member that protrudes from the side surface, the second cantilevered member includes:
   a second free end at which the second cantilevered member terminates;
   a second piezoelectric layer including a fifth surface, a sixth surface opposite to the fifth surface, a third sidewall extends from the fifth surface to the sixth surface and is transverse to the fifth surface and the sixth surface, and a fourth sidewall extends from the fifth surface to the sixth surface, is transverse to the fifth surface and the sixth surface, and is opposite to the third sidewall, the second piezoelectric layer extends from the side surface of the semiconductor substrate to the second free end;
   a third collector layer on the third sidewall, the third collector layer extends from the side surface of the semiconductor substrate to the second free end;
   a fourth collector layer on the fourth sidewall, the fourth collector layer extends from the side surface of the semiconductor substrate to the second free end;
   a third sub-portion on the third collector layer; and
   a fourth sub-portion on the fourth collector layer.

19. The device of claim 18, wherein:
the first collector layer fully separates the first sub-portion from the first piezoelectric layer;
the second collector layer fully separates the second sub-portion from the first piezoelectric layer;
the third collector layer fully separates the third sub-portion from the second piezoelectric layer; and
the fourth collector layer fully separates the fourth sub-portion from the second piezoelectric layer.

20. The device of claim 17, wherein:
the first collector layer fully separates the first sub-portion from the first piezoelectric layer; and
the second collector layer fully separates the second sub-portion from the first piezoelectric layer.

* * * * *

UNITED STATES PATENT AND TRADEMARK OFFICE
CERTIFICATE OF CORRECTION

PATENT NO. : 11,889,765 B2
APPLICATION NO. : 17/181432
DATED : January 30, 2024
INVENTOR(S) : Gianluca Longoni et al.

It is certified that error appears in the above-identified patent and that said Letters Patent is hereby corrected as shown below:

In the Claims

Column 14, Claim 9, Line 41:
"the first directions; and"
Should read:
--the first direction; and--.

Signed and Sealed this
Twenty-sixth Day of March, 2024

Katherine Kelly Vidal
*Director of the United States Patent and Trademark Office*